(12) United States Patent
Ryo et al.

(10) Patent No.: US 12,532,684 B2
(45) Date of Patent: Jan. 20, 2026

(54) PROTECTIVE FILM SUBSTANCE FOR LASER PROCESSING AND METHOD OF PROCESSING WORKPIECE

(71) Applicant: DISCO CORPORATION, Tokyo (JP)

(72) Inventors: Senichi Ryo, Tokyo (JP); Yuki Ikeda, Tokyo (JP); Yukinobu Ohura, Tokyo (JP); Toshiyuki Yoshikawa, Tokyo (JP)

(73) Assignee: DISCO CORPORATION, Tokyo (JP)

(*) Notice: Subject to any disclaimer, the term of this patent is extended or adjusted under 35 U.S.C. 154(b) by 656 days.

(21) Appl. No.: 17/661,581

(22) Filed: May 2, 2022

(65) Prior Publication Data

US 2022/0392805 A1  Dec. 8, 2022

(30) Foreign Application Priority Data

May 24, 2021  (JP) ................. 2021-086691

(51) Int. Cl.
| | |
|---|---|
| *H01L 21/304* | (2006.01) |
| *C09D 5/32* | (2006.01) |
| *C09D 7/20* | (2018.01) |
| *C09D 7/41* | (2018.01) |
| *C09D 129/04* | (2006.01) |
| *H01L 21/78* | (2006.01) |
| *H01L 23/29* | (2006.01) |
| *C08K 5/08* | (2006.01) |
| *H01L 23/31* | (2006.01) |

(52) U.S. Cl.
CPC ............... *H01L 21/78* (2013.01); *C09D 5/32* (2013.01); *C09D 7/20* (2018.01); *C09D 7/41* (2018.01); *C09D 129/04* (2013.01); *H01L 23/293* (2013.01); *C08K 5/08* (2013.01); *H01L 23/3157* (2013.01)

(58) Field of Classification Search
CPC .............. H01L 21/263; H01L 21/304; H01L 21/32131
See application file for complete search history.

(56) References Cited

U.S. PATENT DOCUMENTS

2010/0262212 A1* 10/2010 Shoham .................. A61N 5/06
607/88
2020/0337966 A1* 10/2020 Takezawa ............ A61K 8/0229

FOREIGN PATENT DOCUMENTS

| CN | 104744987 A | 7/2015 |
|---|---|---|
| JP | 2006140311 A | 6/2006 |
| JP | 2007531799 A | 11/2007 |
| | (Continued) | |

OTHER PUBLICATIONS

Office Action issued in counterpart Japanese patent application No. 2021-086691, dated Jan. 21, 2025.

(Continued)

*Primary Examiner* — Thomas T Pham
(74) *Attorney, Agent, or Firm* — Greer Burns & Crain Ltd.

(57) ABSTRACT

A protective film substance for laser processing includes a solution including a water-soluble resin, an organic solvent, and a light absorbent. The solution has an absorbance, i.e., an absorbance converted for a solution diluted 200 times, equal to 0.05 or more per an optical path length of 1 cm at a wavelength of 532 nm. Alternatively, the protective film substance for laser processing includes a solution including a water-soluble resin, an organic solvent, and a polyhydroxyanthraquinone derivative.

11 Claims, 8 Drawing Sheets

(56) References Cited

FOREIGN PATENT DOCUMENTS

| | | |
|---|---|---|
| JP | 2020066666 A | 4/2020 |
| WO | 2005010090 A1 | 2/2005 |

OTHER PUBLICATIONS

Zhang Jianyun et al.; "Determination Method and Stability Study of Carminic Acid"; Food Science, 2007, vol. 28, No. 08 pp. 321-326.

* cited by examiner

INVENTIVE EXAMPLE 1

INVENTIVE EXAMPLE 2

INVENTIVE EXAMPLE 3

COMPARATIVE EXAMPLE 1

COMPARATIVE EXAMPLE 2

COMPARATIVE EXAMPLE 3

0.05

0.15

0.34

0.49

0.97

0.05

0.15

0.34

0.49

0.97

0.05

0.15

0.34

0.49

0.97

PROTECTIVE FILM SUBSTANCE FOR LASER PROCESSING AND METHOD OF PROCESSING WORKPIECE

BACKGROUND OF THE INVENTION

Field of the Invention

The present invention relates to a protective film substance for laser processing, the protective film substance being used to form a protective film on a surface to be laser-processed of a workpiece, and a method of laser-processing a workpiece whose surface to be laser-processed has been covered with a protective film formed from such a protective film substance.

Description of the Related Art

Device chips including devices such as integrated circuits (ICs) and large-scale-integration (LSI) circuits are indispensable components in various electronic appliances such as mobile phones or personal computers. Such device chips are manufactured by dividing a workpiece such as a wafer, e.g., a silicon wafer, with a number of devices formed in respective areas on its face side along projected dicing lines that demarcate those areas, for example.

A laser processing apparatus, for example, is used to divide a workpiece. The laser processing apparatus applies a laser beam having a wavelength of 355 nm, for example, to the workpiece to process the workpiece by way of ablation, i.e., laser ablation.

When laser ablation occurs in the workpiece, a melted mass, i.e., debris, of the material, e.g., silicon, of the workpiece tends to be scattered and applied to the processed surface of the workpiece. If the debris is applied to the processed surface of the workpiece, then the quality of device chips divided from the workpiece is likely to be reduced.

In view of the drawback described above, it has been proposed to, before a workpiece is irradiated with a laser beam, coat a surface to be processed of the workpiece with a protective film substance for laser processing, the protective film substance including a solution including a water-soluble resin, an organic solvent, and an ultraviolet absorbent, and then to dry the solution to form a protective film on the surface to be processed of the workpiece (see, for example, JP 2006-140311A).

The proposed process is effective to prevent debris from being applied to the regions of the surface to be processed of the workpiece that are not irradiated with the laser beam. Since the protective film contains the ultraviolet absorbent, the regions of the protective film that have been irradiated with the laser beam are removed by the laser ablation.

SUMMARY OF THE INVENTION

The laser beam having the wavelength of 355 nm is generally represented by a third harmonic, i.e., a triple wave, of a laser beam, i.e., a fundamental wave, generated with use of a laser medium of neodymium-doped yttrium aluminum garnet (Nd:YAG) or the like. Specifically, the laser beam having the wavelength of 355 nm is generated when a laser beam having a wavelength of 1064 nm passes through two wavelength conversion crystals such as lithium triborate (LBO) crystals, beta barium borate (BBO) crystals, or potassium titanyl phosphate (KTP) crystals.

However, when the laser beam passes through the two wavelength conversion crystals, its power, i.e., output power, is greatly reduced. In view of this problem, there has also been developed a laser processing apparatus capable of irradiating a workpiece with a laser beam having a wavelength of 532 nm represented by a second harmonic, i.e., a double wave, generated when the laser beam as the fundamental wave passes through one wavelength conversion crystal.

Compared to the laser beam having the wavelength of 355 nm, The laser beam having the wavelength of 532 nm passes through few wavelength conversion crystals and has a high conversion efficiency upon conversion from a laser beam having a wavelength of 1064 nm. Therefore, the laser beam having the wavelength of 532 nm is likely to secure higher output power. It is thus suitable to use the laser beam having the wavelength of 532 nm in a process for fully cutting a workpiece with a laser beam.

Specifically, a laser processing apparatus that applies a laser beam having a wavelength of 532 nm to a workpiece to process the workpiece is able to increase the productivity of device chips. However, there has not been developed thus far a protective film substance for laser processing, the protective film substance being capable of forming a protective film on a surface of a workpiece that is to be processed by a laser beam having a wavelength of 532 nm.

Specifically, when a laser beam having a wavelength of 532 nm is applied to a workpiece whose surface to be processed has been coated with an existing protective film produced from a protective film substance for laser processing, the applied laser beam is not absorbed by the protective film but passes through the protective film. The temperature of the interface between the protective film and the workpiece increases due to the heat generated by the laser beam applied to the workpiece to process the workpiece. As a result, the protective film tends to be peeled off from the processed surface of the workpiece and the processed surface of the workpiece is liable to suffer a processing failure such as burn marks.

In view of the above drawbacks, it is an object of the present invention to provide a protective film substance for laser processing, the protective film substance being capable of forming a suitable protective film on a surface to be laser-processed of a workpiece with use of a laser beam having a wavelength of 532 nm, and a method of laser-processing a workpiece whose surface to be laser-processed has been covered with a protective film formed from such a protective film substance.

In accordance with an aspect of the present invention, there is provided a protective film substance for laser processing. The protective film substance includes a solution including a water-soluble resin, an organic solvent, and a light absorbent. The solution has an absorbance converted for a solution diluted 200 times equal to 0.05 or more per an optical path length of 1 cm at a wavelength of 532 nm.

According to the aspect of the present invention, the light absorbent should preferably include a polyhydroxyanthraquinone derivative.

In accordance with another aspect of the present invention, there is provided a protective film substance for laser processing. The protective film substance includes a solution including a water-soluble resin, an organic solvent, and a polyhydroxyanthraquinone derivative.

In the protective film substance for laser processing of the present invention, the polyhydroxyanthraquinone derivative of the protective film substance should preferably include carminic acid.

In the protective film substance for laser processing of the present invention, the solution of the protective film substance should preferably have a pH in a range of 3 to 5.

In accordance with a further aspect of the present invention, there is provided a method of processing a workpiece. The method includes a protective film forming step of forming a protective film covering a surface to be processed of a workpiece by coating the surface with the above-described protective film substance for laser processing, and a processing step of processing the workpiece by applying a laser beam having a wavelength absorbable by the workpiece and the protective film to the workpiece through the protective film.

A suitable protective film can be formed from the protective film substance according to the present invention on a surface to be processed of a workpiece with use of a laser beam having a wavelength of 532 nm.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
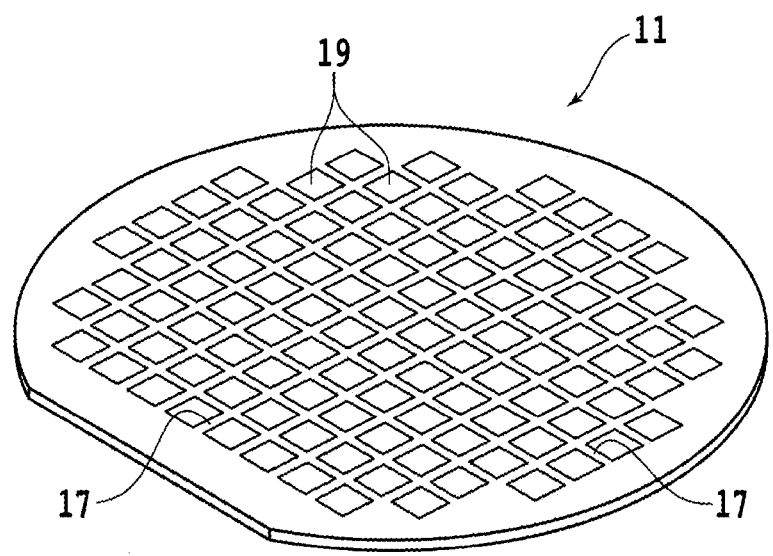
FIG. 1A is a perspective view schematically illustrating a workpiece.

A protective film substance for laser processing (hereinafter also simply referred to as the "protective film substance") according to an aspect of the present invention includes a solution including a water-soluble resin, an organic solvent, and a light absorbent. The water-soluble resin is a major component of a protective film to be formed from the protective film substance on a surface to be processed of a workpiece. The organic solvent lowers the surface tension of the protective film substance and reduces coating irregularities produced when the workpiece is coated with the protective film substance by way of spin coating. The organic solvent also increases the solubility of the light absorbent in the solution of the protective film substance. The light absorbent absorbs a laser beam having a wavelength of 532 nm to cause laser ablation in the protective film.

The water-soluble resin included in the protective film substance is, for example, polyvinylpyrrolidone (PVP), polyvinyl alcohol (PVA), polyethylene glycol, polyethylene oxide, methyl cellulose, ethyl cellulose, hydroxypropyl cellulose, polyacrylic acid, poly-N-vinylacetamide, polystyrene sulfonic acid, special nylon, phenolic resin, methylolmelamine resin, polyglycerin, or any of graft polymers of these water-soluble resins, e.g., PVA grafted with PVP. The protective film substance may include two or more of these water-soluble resins.

Moreover, a water-soluble resin whose properties change due to an external stimulus, e.g., a water-soluble resin whose viscosity changes due to temperature, may be included in the protective film substance. For example, a water-soluble resin whose viscosity becomes higher when the temperature is higher and lower when the temperature is lower may be included in the protective film substance. The protective film substance that includes such a water-soluble resin may flow into grooves formed in a workpiece by a laser beam applied thereto.

Specifically, after a protective film including a water-soluble resin has been formed on a surface to be processed of a workpiece at a high temperature, a laser beam is applied to the protective film and the workpiece, forming grooves in the surface of the workpiece. Then, the temperature is lowered to lower the viscosity of the protective film, i.e., to make the protective film flowable, allowing the protective film that exists around the grooves to flow into the grooves.

Commercially available products of PVP include a plurality of kinds of products known as K-17, K-25, K-30, K-40, K-50, K-60, K-80, K-85, K-90, K-120, etc. These products are classified according to K values calculated by applying relative viscosity values (25° C.) measured by a capillary viscometer to the Fikentscher equation. For example, the product name "PVP K-90" is assigned to a powdery product whose K value is of approximately 90.

There are also a plurality of kinds of powdery products as commercially available products of PVA. These powdery products are classified according to polymerization degrees and saponification degrees. PVA whose saponification degree is 98.0 mol % or higher is also referred to as completely saponified PVA. PVA whose saponification degree ranges from 98.0 mol % to 90.0 mol % is also referred to as intermediately saponified PVA. PVA whose saponification degree ranges from 90.0 mol % to 78.5 mol % is also referred to as partially saponified PVA.

The higher the polymerization degree of PVA is, the higher the viscosity of the solution including PVA is. Therefore, in a case where the protective film substance includes a solution including PVA, the polymerization degree of PVA should preferably range from 200 to 2000 and more preferably range from 300 to 500. The polymerization degree of PVA in these ranges makes it easy to deliver the protective film substance smoothly in an apparatus that supplies workpieces with the protective film substance and also to coat the surface to be processed of a workpiece with the protective film substance by way of spin coating or the like to cover the entire surface of the workpiece with a protective film.

Further, in a case where the protective film substance includes a solution including PVA, the PVA should preferably be partially saponified PVA and, more preferably, the saponification degree thereof should be 82 mol % or less. Since the partially saponified PVA with the saponification degree in that range makes a protective film formed therefrom more easily dissolvable in water, it is easy to wash away the protective film from the workpiece that has been processed by the laser beam.

The organic solvent included in the protective film substance is, for example, methyl alcohol, ethyl alcohol, isopropyl alcohol, ester, alkylene glycol monoalkyl ether, alkylene glycol, or alkylene glycol monoalkyl ether acetate. Alkyleneglycol monoalkyl ether should preferably be propylene glycol monomethyl ether (PGME). The protective film substance may include two or more of these organic solvents.

The weight of the organic solvent included in the protective film substance should preferably be 20 wt % or less of the entire weight of the protective film substance and more preferably be 15 wt % or less of the entire weight of the protective film substance in view of the safety of the organic solvent, the resistance of an adhesive layer included in a dicing tape to be affixed to the workpiece, etc.

For example, PGME included in the protective film substance is able to reduce the surface tension of the protective film substance. Consequently, the protective film substance can be applied to the surface to be processed of the workpiece by way of spin coating or the like to cover the entire surface of the workpiece with a protective film.

For applying the protective film substance to the surface to be processed of the workpiece by way of spin coating, the workpiece with the protective film substance applied to the surface thereof to be processed may be rotated at a speed in the range of 1500 to 3000 rpm continuously for a period of time ranging from 30 to 180 seconds, for example. Alternatively, after the workpiece has been rotated at a low speed of 1000 rpm or less to spread the applied protective film substance over the entire surface thereof to be processed, the workpiece may be rotated at a speed in the range of 1500 to 3000 rpm to coat the entire surface to be processed of the workpiece with a protective film.

The light absorbent included in the protective film substance is, for example, an anthocyanin derivative, a phthalocyanin derivative, a flavonoid derivative, a quinacridone derivative, an azobenzene derivative, a perylene derivative, a diketopyrrole derivative, an indigo derivative, or a polyhydroxyanthraquinone derivative. Particularly, the light absorbent should preferably be a polyhydroxy anthraquinone derivative.

The polyhydroxy anthraquinone derivative may be, for example, one of the compounds (alizarin, quinizarin, anthrarufin, chrysazin, anthrafravic acid, aloe emodin, 1,5-diamino-4,8-dihydroxyanthraquinone, 4,5-dihydroxyanthraquinone-2-carboxylic acid, purpurin, emodin, mitoxantrone, doxorubicin, daunorubicin, and carminic acid (CA)) represented respectively by the following structural formulas.

[Structural formula 1]

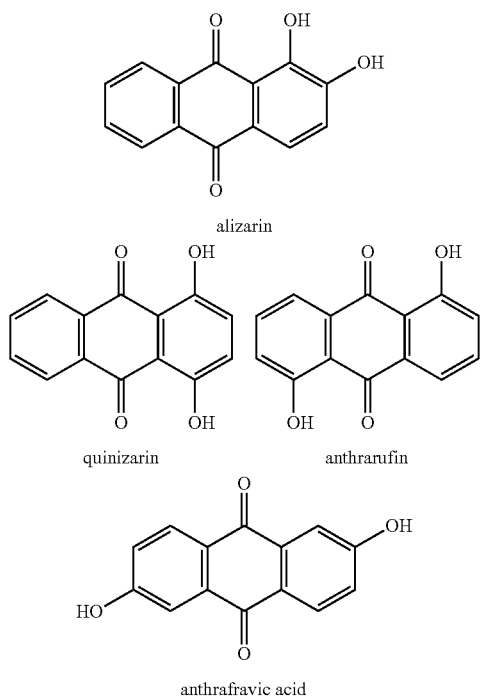

alizarin quinizarin anthrarufin anthrafravic acid

[Structural formula 2]

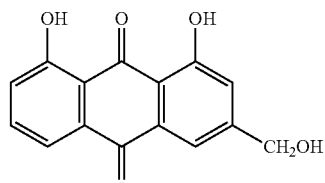

aloe emodin

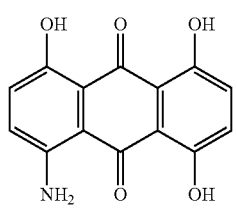

1,5-diamino-4, 8-dihydroxyanthraquinone

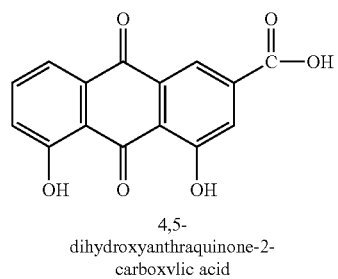

4,5-dihydroxyanthraquinone-2-carboxylic acid

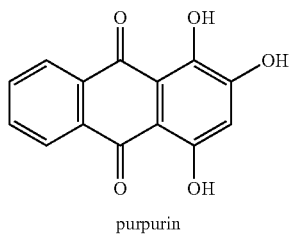

purpurin

[Structural formula 3]

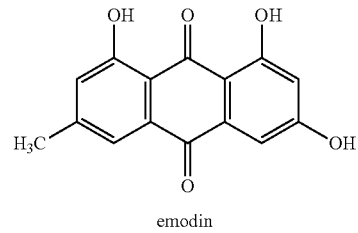

emodin

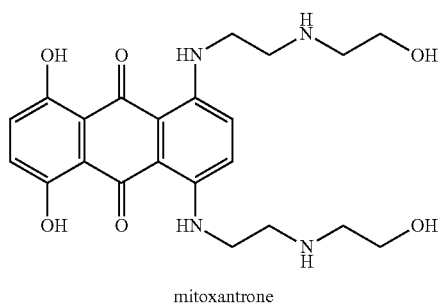

mitoxantrone

-continued

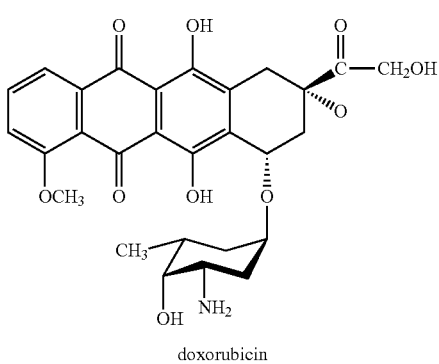
doxorubicin

[Structrural formula 4]

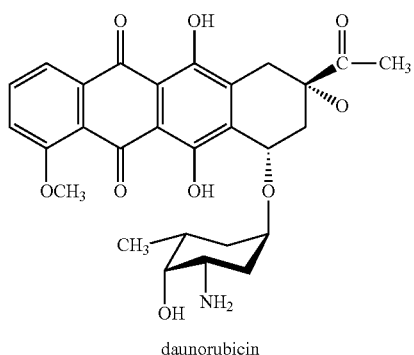
daunorubicin

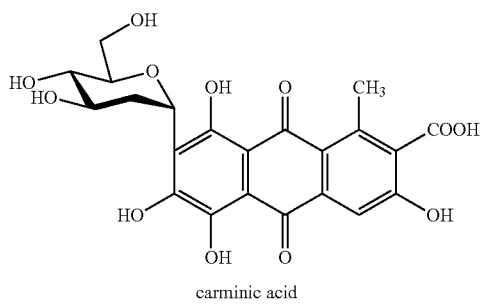
carminic acid

In particular, the light absorbent included in the protective film substance should preferably be CA for the following reasons. First, CA has a high absorbance with respect to light having a wavelength of 532 nm. Therefore, when the workpiece is processed, i.e., laser-processed, by a laser beam having a wavelength of 532 nm through the protective film formed from the protective film substance, the protective film that includes CA as the light absorbent is easily removed by way of laser ablation. As such, the laser processing does not cause laser processing difficulties that would otherwise be caused by remnants of the protective film.

In addition, CA is highly soluble in water. Therefore, after the laser processing, CA included in the proactive film can easily be washed away. Moreover, CA has a high fluorescence intensity. Thereafter, after the protective film has been formed on the surface to be processed of the workpiece, it can easily be confirmed whether or not the protective film covers the entire surface to be processed of the workpiece by detecting fluorescence emitted when the protective film is irradiated with excitation light.

Further, CA has highly resistant to light and heat. Therefore, even in situations where a protective film substance including CA as a light absorbent is stored over a long period of time, the probability of changes in the molecular structure of the CA is low. CA is also easily available as it is used as a colorant for processed foods, etc.

The protective film substance includes water, preferably pure water. The protective film substance may include additives for improving various characteristics thereof.

An additive included in a protective film substance is, for example, ascorbic acid (AA), trimethylol propane (TMP), triethanol amine (TEA), methyl p-hydroxy benzoate (MPB), or the like. The protective film substance may include two or more of these additives.

A protective film formed from a protective film substance including AA has increased color stability. TMP is highly soluble in water. Therefore, after the laser processing on a protective film formed from a protective film substance including TMP, the TMP included in the proactive film can easily be washed away. Further, in a case where TMP is included in a protective film, the TMP increases the thickness of the protective film and prevents the protective film from being carbonized upon laser ablation.

TEA added to a protective film substance is able to restrain the protective film substance from being altered while the protective film substance is in storage. Specifically, an ion exchange process may be performed on a protective film substance in order to remove metal impurities such as sodium (Na) and potassium (Ka) therefrom. The ion exchange process may lower the pH of the protective film substance, e.g., to less than 3.0. If the protective film substance with a low pH is stored over a long period of time at a low storage temperature, e.g., over one month at 10° C., then the protective film substance is turned into a gel.

TEA added to a protective film substance that has been treated by an ion exchange process is able to shift its pH toward neutrality. The added TEA prevents the protective film substance from being turned into a gel at a low storage temperature. When the pH of a protective film substance is shifted toward neutrality, e.g., when the pH rises beyond 5.0, by adding a pH regulator such as TEA, bacteria such as general bacteria, heterotrophic bacteria, and true fungi may tend to propagate during prolonged storage. The propagation of bacteria can be restrained by adding MPB or the like to the protective film substance.

However, in order to reduce the cost at which to manufacture a protective film substance and to increase the productivity thereof, it is preferable for the protective film substance to have fewer additives included therein. In view of these considerations, it is preferable to prepare a protective film substance such that its pH is in the range of 3 to 5 and more preferable to prepare a protective film substance such that its pH is in the range of 3 to 4.

Inventive Examples

Inventive Examples of the present invention will be described below. First, protective film substances according to Inventive Examples 1 through 3 including the various materials set forth in the table below were prepared.

TABLE 1

|  | Inventive Example 1 | Inventive Example 2 | Inventive Example 3 |
|---|---|---|---|
| Water-soluble resin | PVA: 12.00 (g) | PVP: 5.98 (g) | PVP: 4.10 (g) |
| Light absorbent | CA: 0.70 (g) | CA: 0.70 (g) | CA: 0.47 (g) |
| Organic solvent | PGME: 14.90 (g) | PGME: 14.90 (g) | PGME: 14.90 (g) |
| Additives | TEA: 1.50 (g) | TEA: 1.50 (g) | TEA: 1.50 (g) |
|  | MPB: 0.10 (g) | MPB: 0.10 (g) | MPB: 0.10 (g) |
| Pure water | Remainder | Remainder | Remainder |
| Total | 100 (g) | 100 (g) | 100 (g) |

Specifically, a first solution was prepared by dissolving a powdery water-soluble resin, i.e., PVA or PVP, in water, and a second solution was prepared by dissolving a powdery light absorbent, i.e., CA, and an additive, i.e., MPB, in an organic solvent, i.e., PGME. The PVA had a polymerization degree of 300 and a saponification degree in the range of 78.5 mol % to 81.5 mol %. The PVP had a K value of approximately 90.

Then, after an ion exchange process and a filtering process were performed on the second solution, an additive, i.e., TEA, was added to the second solution, producing a third solution. The protective film substances according to Inventive Examples 1 through 3 were obtained in the manner described above.

Further, protective film substances according to Comparative Examples 1 through 3 including the various materials set forth in the table below were prepared. The protective film substances according to Comparative Examples 1 through 3 were simply different from the protective film substances according to Inventive Examples 1 through 3 in that they include an ultraviolet absorbent of ferulic acid (FA) instead of CA as a light absorbent. FA is a compound generally used as a light absorbent included in a protective film formed on a surface of a workpiece that is to be processed by a laser beam having a wavelength of 355 nm.

TABLE 2

|  | Comparative Example 1 | Comparative Example 2 | Comparative Example 3 |
|---|---|---|---|
| Water-soluble resin | PVA: 12.00 (g) | PVP: 6.50 (g) | PVP: 4.30 (g) |
| Light absorbent | FA: 0.40 (g) | FA: 0.30 (g) | FA: 0.20 (g) |
| Organic solvent | PGME: 15.00 (g) | PGME: 14.00 (g) | PGME: 14.30 (g) |
| Additives | TMP: 11.00 (g) | AA: $2.5 \times 10^{-3}$ (g) | AA: $1.5 \times 10^{-3}$ (g) |
|  | AA: 0.01 (g) |  |  |
| Pure water | Remainder | Remainder | Remainder |
| Total | 100 (g) | 100 (g) | 100 (g) |

Specifically, a fourth solution was prepared by dissolving a powdery water-soluble resin, i.e., PVA or PVP, and additives, i.e., TMP and/or AA, in water, and a fifth solution was prepared by dissolving a powdery light absorbent, i.e., FA, in an organic solvent, i.e., PGME. The PVA had a polymerization degree of 300 and a saponification degree in the range of 78.5 mol % to 81.5 mol %. The PVP had a K value of approximately 90.

Then, an ion exchange process and a filtering process were performed on the fifth solution to reduce metal impurities, particularly sodium, included in the fifth solution. The protective film substances according to Comparative Examples 1 through 3 were obtained in the manner described above.

The protective film substances according to Inventive Examples 1 through 3 and Comparative Examples 1 through 3 thus produced had respective viscosities at 25° C. and the respective solutions of the protective film substances had respective absorbances at a wavelength of 532 nm, i.e., respective absorbances converted for a solution diluted 200 times, as set forth in the table below.

TABLE 3

|  | In.Ex.1 | In.Ex.2 | In.Ex.3 | Co.Ex.1 | Co.Ex.2 | Co.Ex.3 |
|---|---|---|---|---|---|---|
| Viscosity (mPa · s) | 48 | 194 | 65 | 50 | 230 | 76 |
| Absorbance | 0.34 | 0.34 | 0.23 | 0 | 0 | 0 |

The absorbances were assessed by diluting the respective protective film substances 200 times with pure water and measuring respective absorption spectrums of the diluted protective film substances while they were sealed in respective prismatic cells of quartz. In the measurements, the optical path length was of 1 cm.

Then, a protective film forming step was carried out to coat the surfaces to be processed of workpieces with the respective protective film substances according to Inventive Examples 1 through 3 and Comparative Examples 1 through 3 to form protective films respectively on the surfaces to be processed of the workpieces. First, a workpiece having a surface to be processed on which a protective film is to be formed will be described below.

Figure 1B:
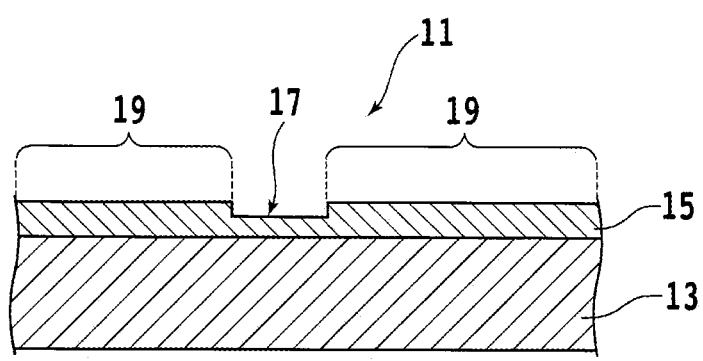
FIG. 1B is an enlarged fragmentary cross-sectional view schematically illustrating a portion of the workpiece.

FIG. 1A schematically illustrates in perspective a workpiece having a surface to be processed on which a protective film is to be formed. FIG. 1B schematically illustrates a portion of the workpiece in enlarged fragmentary cross section. As illustrated in FIGS. 1A and 1B, the workpiece, generally denoted by 11, is a disk-shaped wafer having an orientation flat on its outer edge that represents the crystal orientation of the wafer.

The workpiece 11 has a substrate 13 that is made of silicon (Si) and that includes impurity regions doped with an impurity in portions of a face side, i.e., an upper surface, thereof. A functional layer 15 including a plurality of electrically insulative films and a plurality of electrically conductive films is disposed on the face side of the substrate 13. The workpiece 11 has a plurality of areas demarcated on the functional layer 15 by a grid of streets 17.

Portions of the substrate 13, i.e., the impurity regions and intrinsic semiconductor regions where the impurity is not doped, and portions of the functional layer 15, i.e., the electrically insulative films and the electrically conductive films, the portions of the substrate 13 and the portions of the functional layer 15 being included in the respective demarcated areas, make up a plurality of devices, e.g., ICs or the like, 19. The functional layer 15 in the areas where the devices 19 are provided is slightly thicker than the functional layer 15 in the streets 17. In other words, the devices 19 are protruding portions slightly protruding upwardly beyond the streets 17.

Figure 2:
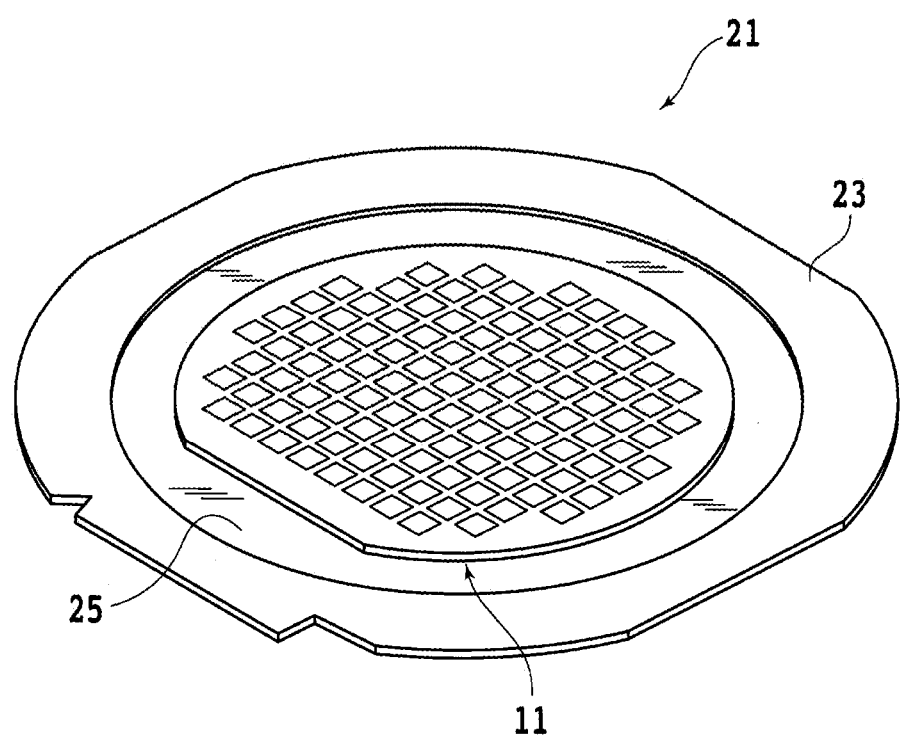
FIG. 2 is a perspective view schematically illustrating a frame unit that includes the workpiece.

A frame unit including the workpiece 11 will be described below. FIG. 2 schematically illustrates a frame unit including the workpiece 11 in perspective. As illustrated in FIG. 2, the frame unit, generally denoted by 21, has an annular frame 23 made of a metal material. The annular frame 23 has an opening larger in diameter than the workpiece 11.

The frame unit 21 also has a disk-shaped tape 25 having an outer circumferential portion affixed to the annular frame 23 in closing relation to the opening therein. The substrate 13 of the workpiece 11 is affixed to a central portion of the tape 25. The workpiece 11 is thus integrally combined with the annular frame 23 by the tape 25.

Figure 3A:
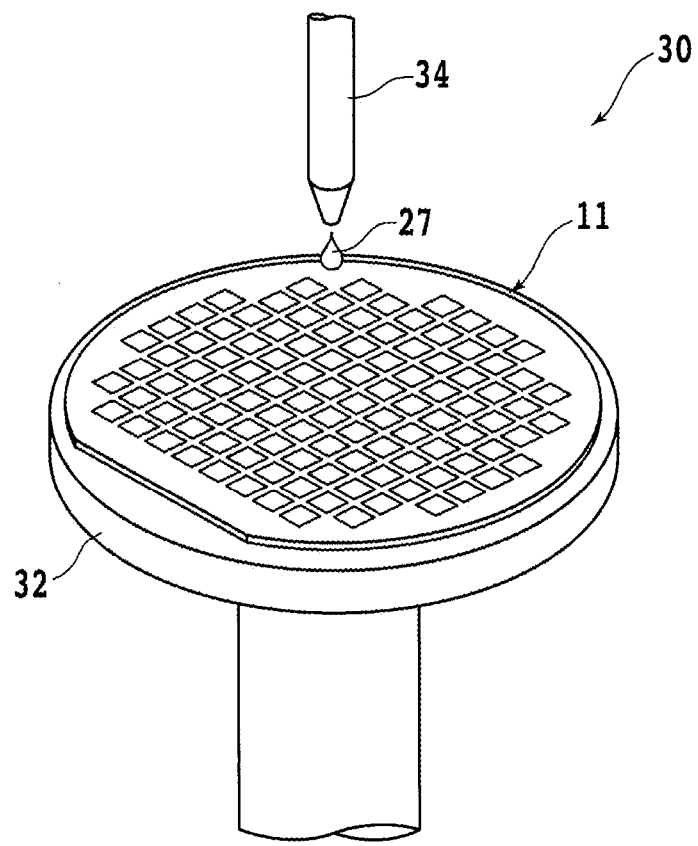
FIG. 3A is a perspective view schematically illustrating the manner in which a protective film forming step is carried out.

The protective film forming step will be described below. FIG. 3A schematically illustrates in perspective the manner in which the protective film forming step is carried out. In FIG. 3A, the annular frame 23 and the tape 25 of the frame unit 21 is omitted from illustration. The protective film forming step is carried out with use of a spin coater 30 illustrated in FIG. 3A.

The spin coater 30 has a chuck table 32 for holding the workpiece 11 thereon. The chuck table 32 is connected to a rotary actuator, not illustrated, such as an electric motor, and is rotatable by the rotary actuator about a rotational axis represented by a straight line generally parallel to vertical directions.

The spin coater 30 includes a disk-shaped porous plate, not illustrated, disposed on an upper side of the chuck table 32. The porous plate is made of a porous material and is connected to a suction source, not illustrated, such as an ejector. When the suction source is actuated, it generates a suction force and applies it to the porous plate, which holds the workpiece 11 under suction on an upper surface thereof.

A nozzle 34 for supplying a protective film substance 27 in a liquid phase to a central area of the upper surface of the porous plate is disposed above the chuck table 32. The nozzle 34 is connected to a supply source, not illustrated, of the protective film substance 27 through a fluid channel, not illustrated.

In the protective film forming step, the workpiece 11 is placed on the chuck table 32 such that the substrate 13 of the workpiece 11 faces the porous plate on the chuck table 32 with the tape 25 interposed therebetween. Then, the suction source is actuated to attract the substrate 13 of the workpiece 11 under suction to the porous plate on the chuck table 32 and hence to hold the workpiece 11 under suction on the chuck table 32.

Next, the nozzle 34 supplies the protective film substance 27 in the liquid phase at a predetermined rate to the functional layer 15 of the workpiece 11 on the chuck table 32. Then, the rotary actuator is energized to rotate the chuck table 32 at a rotational speed of 2000 rpm for a period of 60 seconds.

Therefore, the protective film substance 27 is applied to the functional layer 15 of the workpiece 11 by way of spin coating. Then, the nozzle 34 stops supplying the protective film substance 27, and the protective film substance 27 applied to the functional layer 15 of the workpiece 11 is dried and turned into a protective film 29 covering the functional layer 15 of the workpiece 11.

Figure 3B:
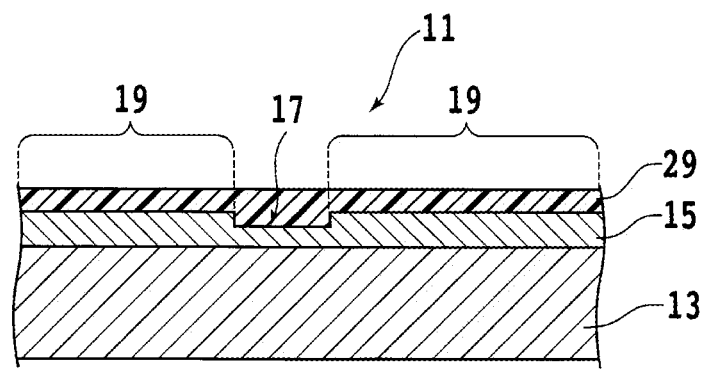
FIG. 3B is an enlarged fragmentary cross-sectional view schematically illustrating a portion of the workpiece on which a projective film has been formed.

FIG. 3B schematically illustrates in enlarged fragmentary cross section a portion of the workpiece 11 on which the protective film 29 has been formed. The protective film 29 includes areas of different thicknesses due to the surface irregularities of the functional layer 15 that are produced by the devices 19 slightly protruding upwardly beyond the streets 17, and has a flat upper surface.

Protective films 29 formed respectively from the protective film substances according to Inventive Examples 1 through 3 and Comparative Examples 1 through 3 had respective film thicknesses, i.e., film thicknesses of the portions of the protective films 29 overlapping the streets 17, as set forth in the table below.

TABLE 4

|  | In.Ex.1 | In.Ex.2 | In.Ex.3 | Co.Ex.1 | Co.Ex.2 | Co.Ex.3 |
| --- | --- | --- | --- | --- | --- | --- |
| Film thickness (μm) | 2.0 | 1.0 | 0.5 | 2.0 | 1.0 | 0.5 |

Figure 4:
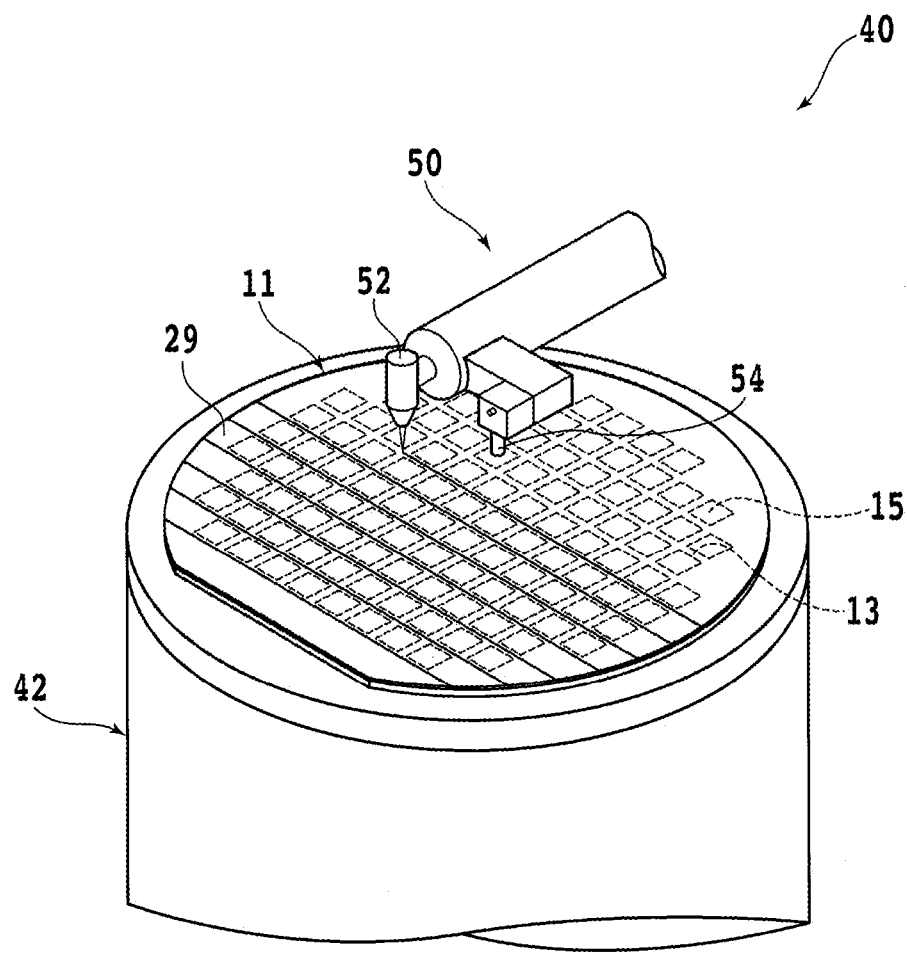
FIG. 4 is a perspective view schematically illustrating the manner in which a processing step is carried out.

Then, a processing step was carried out to process the workpiece 11 by applying a laser beam having a wavelength of 532 nm to the workpiece 11 through the protective film 29 formed on the surface, i.e., the surface to be processed, of the workpiece 11 on the functional layer 15 side. FIG. 4 schematically illustrates in perspective the manner in which the processing step is carried out. In FIG. 4, the annular frame 23 and the tape 25 of the frame unit 21 is omitted from illustration.

X-axis directions and Y-axis directions illustrated in FIG. 4 extend perpendicularly to each other on a horizontal plane. Z-axis directions, i.e., upward and downward directions, represent vertical directions perpendicular to the X-axis directions and the Y-axis directions. The processing step was carried out on a laser processing apparatus 40 illustrated in FIG. 4.

The laser processing apparatus 40 has a chuck table 42 for holding the substrate 13 of the workpiece 11 under suction thereon. The chuck table 42 has a rotary actuator, a porous plate, and a suction source similar to those of the chuck table 32 illustrated in FIG. 3A. These components of the chuck table 42 will not be described in detail below.

An X-axis moving mechanism, not illustrated, for moving the chuck table 42 along the X-axis directions and a Y-axis moving mechanism, not illustrated, for moving the chuck table 42 along the Y-axis directions are disposed below the chuck table 42.

A laser beam applying unit 50 for applying a pulsed laser beam is disposed above a porous plate, not illustrated, on the chuck table 42. The laser beam applying unit 50 emits a pulsed laser beam having a wavelength of 532 nm from a head 52 thereof toward the chuck table 42.

Specifically, the laser beam applying unit 50 includes a laser oscillator, not illustrated, for generating a laser beam having a wavelength of 1064 nm by using Nd:YAG as a laser medium. The laser beam generated by the laser oscillator is converted into a laser beam having a wavelength of 532 nm by passing through a wavelength conversion crystal, not illustrated.

The laser beam applying unit 50 also includes a frequency setting unit, not illustrated, for setting a repetitive frequency for the laser beam generated by the laser oscillator. The frequency setting unit sets the repetitive frequency for the laser beam to a predetermined frequency.

The laser beam emitted from the head 52 has its repetitive frequency set to a predetermined frequency in the range of 5 to 50000 kHz by the frequency setting unit. The frequency setting unit may set the repetitive frequency for the laser beam to a predetermined frequency in the range of 50 to 1000 kHz.

The laser beam emitted from the head 52 has a pulse duration that is of a predetermined value in the range of 10 fs to 300 ns where fs represents femtosecond. The laser beam emitted from the head 52 has an output power level that is of a predetermined value in the range of 0.01 to 100.0 W. The laser beam is converged into a focused spot having a beam width or spot diameter that is of a predetermined value in the range of 1 to 100 µm. When the laser beam is emitted from the head 52 toward the chuck table 42, the chuck table 42 is moved at a speed, i.e., a feed speed, that has a predetermined value in the range of 20 to 10000 mm/s.

An image capturing unit 54 is mounted on the laser beam applying unit 50 at a position adjacent to the head 52. The image capturing unit 54 includes a light source, not illustrated, for applying a visible light to the workpiece 11 held on the chuck table 42 and an image capturing device, not illustrated, for capturing an image of the workpiece 11 on the basis of reflected light from the workpiece 11.

In the processing step, the workpiece 11 is placed on the chuck table 42 such that the substrate 13 of the workpiece 11 faces the porous plate on the chuck table 42 with the tape 25 interposed therebetween. Then, the suction source is actuated to attract the substrate 13 of the workpiece 11 under suction to the porous plate on the chuck table 42 and hence to hold the workpiece 11 under suction on the chuck table 42.

Next, on the basis of an image captured of a plurality of streets 17 on the functional layer 15 of the workpiece 11 by the image capturing unit 54, the rotary actuator is energized to rotate the chuck table 42 about its central axis to an angular position where some of the streets 17 extend parallel to the X-axis directions and the remaining streets 17 extend parallel to the Y-axis directions.

Then, while the pulsed laser beam having the wavelength of 532 nm is being emitted from the head 52 to the functional layer 15 of the workpiece 11, the X-axis moving mechanism is actuated to move the chuck table 42 in one of the X-axis directions, thereby laser-processing the workpiece 11, i.e., processing the workpiece 11 with the applied pulsed laser beam, along one of the streets 17 extending parallel to the X-axis directions. The applied pulsed laser beam cuts and removes the protective film 29 and the workpiece 11 along the street 17, creating slits in the protective film 29 and the workpiece 11 and exposing a narrow straight area of the tape 25 underlying the slits along the street 17.

The pulsed laser beam had an output power level of 7 W and a repetitive frequency of 100 kHz. The chuck table 42 was moved at a speed of 300 mm/s, and the pulsed laser beam applied to the workpiece 11 had an overlap ratio of 90%.

Thereafter, the workpiece 11 was similarly processed with the pulsed laser beam until the protective film 29 and the workpiece 11 were cut and removed along all the streets 17, creating slits in the protective film 29 and the workpiece 11 and exposing narrow straight areas of the tape 25 underlying the slits along all the streets 17.

Then, the image capturing unit 54 captured an image of an area of the workpiece 11 where a pair of streets 17 intersect with each other at a point of intersection on the functional layer 15.

Figure 5A:
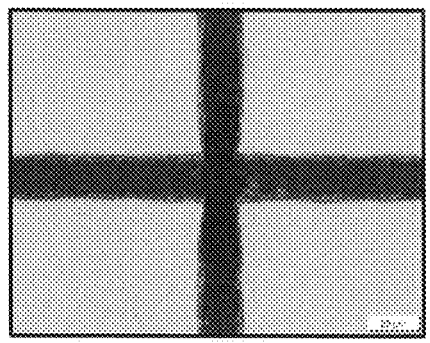
FIG. 5A is a view illustrating an image of a workpiece on which a protective film has been formed with use of a protective film substance according to Inventive Example 1 and which has been laser-processed.
Figure 5B:
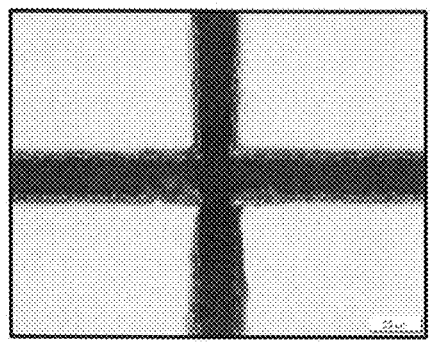
FIG. 5B is a view illustrating an image of a workpiece on which a protective film has been formed with use of a protective film substance according to Inventive Example 2 and which has been laser-processed.
Figure 5C:
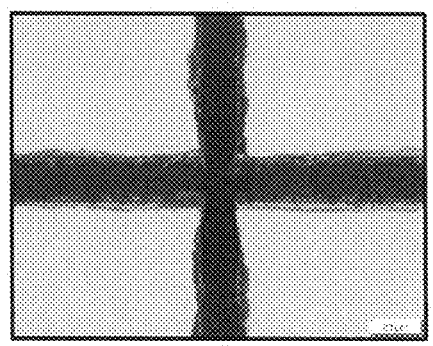
FIG. 5C is a view illustrating an image of a workpiece on which a protective film has been formed with use of a protective film substance according to Inventive Example 3 and which has been laser-processed.
Figure 5D:
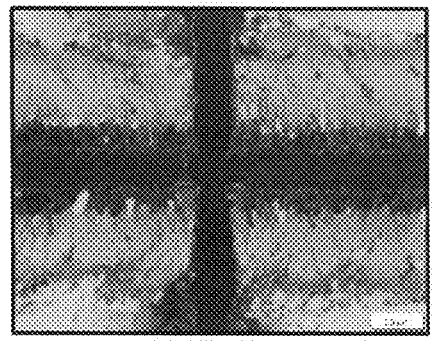
FIG. 5D is a view illustrating an image of a workpiece on which a protective film has been formed with use of a protective film substance according to Comparative Example 1 and which has been laser-processed.
Figure 5E:
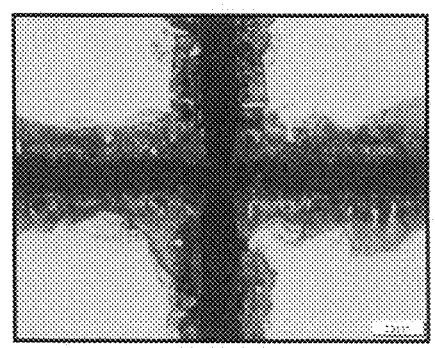
FIG. 5E is a view illustrating an image of a workpiece on which a protective film has been formed with use of a protective film substance according to Comparative Example 2 and which has been laser-processed.
Figure 5F:
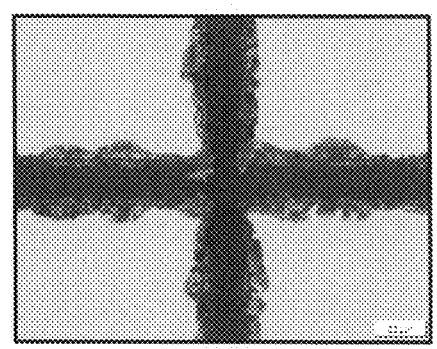
FIG. 5F is a view illustrating an image of a workpiece on which a protective film has been formed with use of a protective film substance according to Comparative Example 3 and which has been laser-processed.

FIG. 5A illustrates an image of the workpiece 11 at the point of intersection with a protective film 29 formed on the functional layer 15 with use of the protective film substance according to Inventive Example 1, the workpiece 11 having been laser-processed. Similarly, FIGS. 5B, 5C, 5D, 5E, and 5F illustrate respective images of workpieces 11 at points of intersection with protective films 29 formed on the functional layers 15 with use of the protective film substances according to Inventive Examples 2 and 3 and Comparative Examples 1 through 3, the workpieces 11 having been laser-processed.

As illustrated in FIGS. 5A through 5F, it has been found that the workpiece 11 was well laser-processed when either one of the protective film substances according to Inventive Examples 1 through 3 was used, compared with when either one of the protective film substances according to Comparative Examples 1 through 3 was used. In other words, it has been found that protective films suitable for laser processing with the laser beam having the wavelength of 532 nm can be formed from the protective film substances according to Inventive Examples 1 through 3.

Further, there were prepared 15 kinds of protective film substances where their solutions had their absorbances, i.e., absorbances converted for a solution diluted 200 times, of 0.05, 0.15, 0.34, 0.49, and 0.97 per an optical path length of 1 cm at the wavelength of 532 nm, by adjusting the amount of CA included in the protective film substances according to Inventive Examples 1 through 3.

Then, the image capturing unit 54 captured images of areas of workpieces 11 at points of intersection with protective films 29 formed, on the functional layers 15, from the respective 15 kinds of protective film substances, the workpieces 11 having been laser-processed.

Figure 6A:
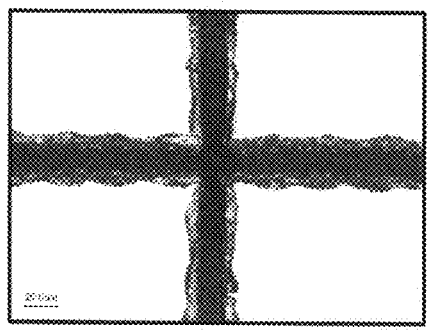
FIG. 6A is a view illustrating an image of a workpiece on which a protective film has been formed with use of a protective film substance according to Inventive Example 1 that has been prepared to make its absorbance, i.e., an absorbance converted for a solution diluted 200 times, equal to 0.05 per an optical path length of 1 cm, the workpiece having been laser-processed.
Figure 6B:
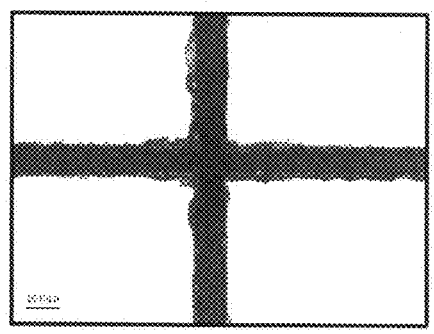
FIG. 6B is a view illustrating an image of a workpiece on which a protective film has been formed with use of a protective film substance according to Inventive Example 1 that has been prepared to make its absorbance, i.e., an absorbance converted for a solution diluted 200 times, equal to 0.15 per an optical path length of 1 cm, the workpiece having been laser-processed.
Figure 6C:
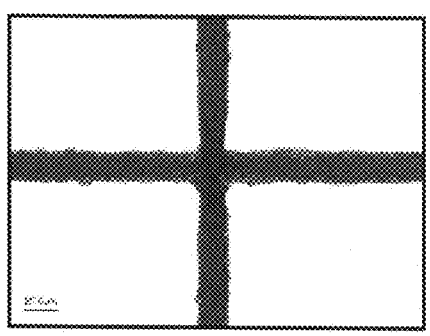
FIG. 6C is a view illustrating an image of a workpiece on which a protective film has been formed with use of a protective film substance according to Inventive Example 1 that has been prepared to make its absorbance, i.e., an absorbance converted for a solution diluted 200 times, equal to 0.34 per an optical path length of 1 cm, the workpiece having been laser-processed.
Figure 6D:
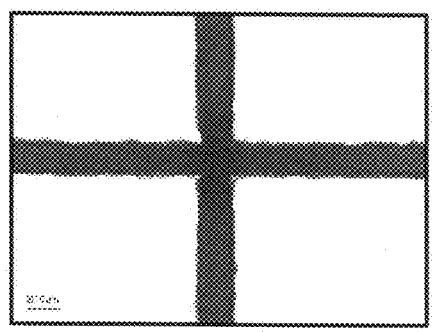
FIG. 6D is a view illustrating an image of a workpiece on which a protective film has been formed with use of a protective film substance according to Inventive Example 1 that has been prepared to make its absorbance, i.e., an absorbance converted for a solution diluted 200 times, equal to 0.49 per an optical path length of 1 cm, the workpiece having been laser-processed.
Figure 6E:
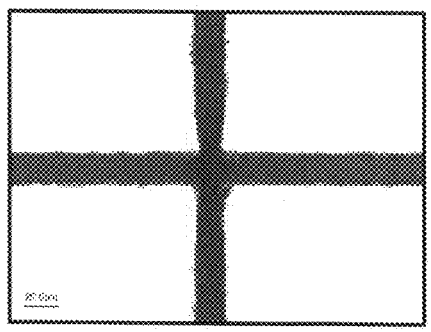
FIG. 6E is a view illustrating an image of a workpiece on which a protective film has been formed with use of a protective film substance according to Inventive Example 1 that has been prepared to make its absorbance, i.e., an absorbance converted for a solution diluted 200 times, equal to 0.97 per an optical path length of 1 cm, the workpiece having been laser-processed.

FIG. 6A illustrates an image of the workpiece 11 at the point of intersection with a protective film 29 formed, on the functional layer 15, from the protective film substance according to Inventive Example 1 that has been prepared to make its absorbance, i.e., an absorbance converted for a solution diluted 200 times, equal to 0.05 per an optical path length of 1 cm, the workpiece 11 having been laser-processed. Similarly, FIGS. 6B, 6C, 6D, and 6E illustrate respective images of the workpieces 11 at the points of intersection with protective films 29 formed, on the functional layers 15, from the protective film substance according to Inventive Example 1 that has been prepared to make its absorbance, i.e., an absorbance converted for a solution diluted 200 times, equal to 0.15, 0.34, 0.49, and 0.97 per an optical path length of 1 cm, the workpieces 11 having been laser-processed.

Figure 7A:
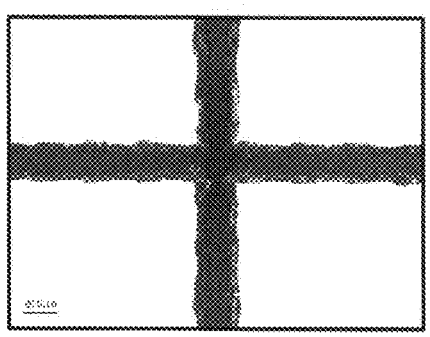
FIG. 7A is a view illustrating an image of a workpiece on which a protective film has been formed with use of a protective film substance according to Inventive Example 2 that has been prepared to make its absorbance, i.e., an absorbance converted for a solution diluted 200 times, equal to 0.05 per an optical path length of 1 cm, the workpiece having been laser-processed.
Figure 7B:
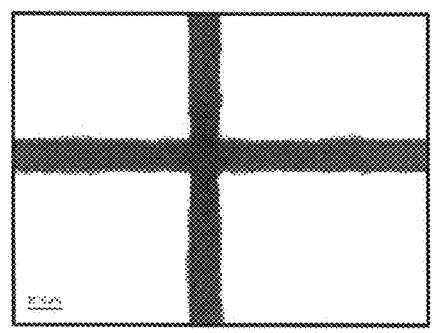
FIG. 7B is a view illustrating an image of a workpiece on which a protective film has been formed with use of a protective film substance according to Inventive Example 2 that has been prepared to make its absorbance, i.e., an absorbance converted for a solution diluted 200 times, equal to 0.15 per an optical path length of 1 cm, the workpiece having been laser-processed.
Figure 7C:
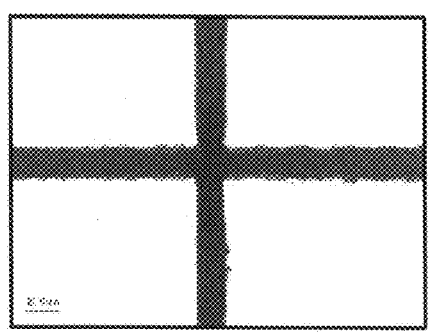
FIG. 7C is a view illustrating an image of a workpiece on which a protective film has been formed with use of a protective film substance according to Inventive Example 2 that has been prepared to make its absorbance, i.e., an absorbance converted for a solution diluted 200 times, equal to 0.34 per an optical path length of 1 cm, the workpiece having been laser-processed.
Figure 7D:
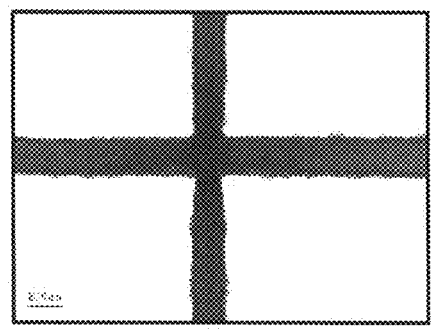
FIG. 7D is a view illustrating an image of a workpiece on which a protective film has been formed with use of a protective film substance according to Inventive Example 2 that has been prepared to make its absorbance, i.e., an absorbance converted for a solution diluted 200 times, equal to 0.49 per an optical path length of 1 cm, the workpiece having been laser-processed.
Figure 7E:
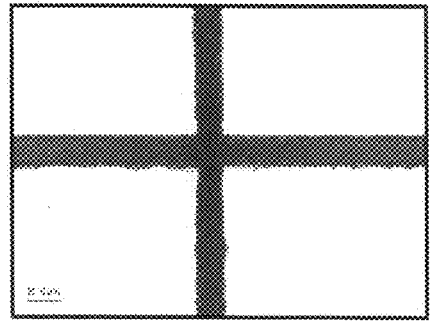
FIG. 7E is a view illustrating an image of a workpiece on which a protective film has been formed with use of a protective film substance according to Inventive Example 2 that has been prepared to make its absorbance, i.e., an absorbance converted for a solution diluted 200 times, equal to 0.97 per an optical path length of 1 cm, the workpiece having been laser-processed.

FIG. 7A illustrates an image of the workpiece 11 at the point of intersection with a protective film 29 formed, on the functional layer 15, from the protective film substance according to Inventive Example 2 that has been prepared to make its absorbance, i.e., an absorbance converted for a solution diluted 200 times, equal to 0.05 per an optical path length of 1 cm, the workpiece 11 having been laser-processed. Similarly, FIGS. 7B, 7C, 7D, and 7E illustrate respective images of the workpieces 11 at the points of intersection with protective films 29 formed, on the functional layers 15, from the protective film substance according to Inventive Example 2 that has been prepared to make its absorbance, i.e., an absorbance converted for a solution diluted 200 times, equal to 0.15, 0.34, 0.49, and 0.97 per an optical path length of 1 cm, the workpieces 11 having been laser-processed.

Figure 8A:
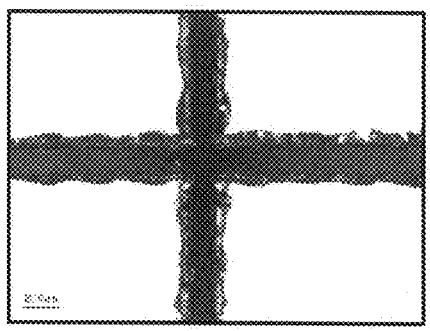
FIG. 8A is a view illustrating an image of a workpiece on which a protective film has been formed with use of a protective film substance according to Inventive Example 3 that has been prepared to make its absorbance, i.e., an absorbance converted for a solution diluted 200 times, equal to 0.05 per an optical path length of 1 cm, the workpiece having been laser-processed.
Figure 8B:
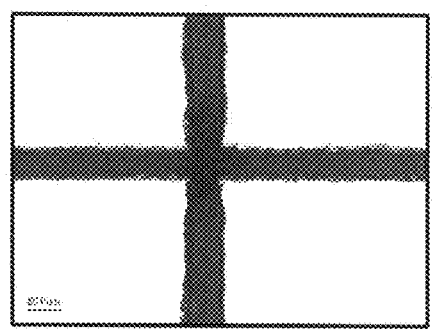
FIG. 8B is a view illustrating an image of a workpiece on which a protective film has been formed with use of a protective film substance according to Inventive Example 3 that has been prepared to make its absorbance, i.e., an absorbance converted for a solution diluted 200 times, equal to 0.15 per an optical path length of 1 cm, the workpiece having been laser-processed.
Figure 8C:
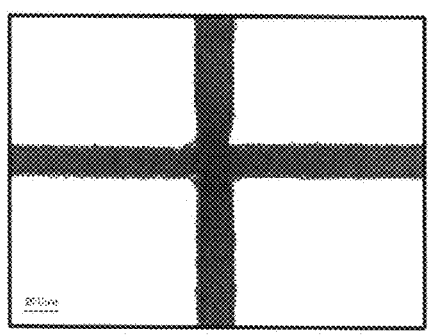
FIG. 8C is a view illustrating an image of a workpiece on which a protective film has been formed with use of a protective film substance according to Inventive Example 3 that has been prepared to make its absorbance, i.e., an absorbance converted for a solution diluted 200 times, equal to 0.34 per an optical path length of 1 cm, the workpiece having been laser-processed.
Figure 8D:
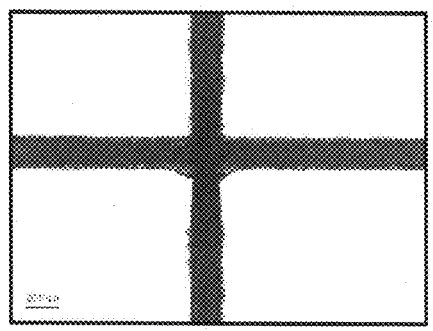
FIG. 8D is a view illustrating an image of a workpiece on which a protective film has been formed with use of a protective film substance according to Inventive Example 3 that has been prepared to make its absorbance, i.e., an absorbance converted for a solution diluted 200 times, equal to 0.49 per an optical path length of 1 cm, the workpiece having been laser-processed.
Figure 8E:
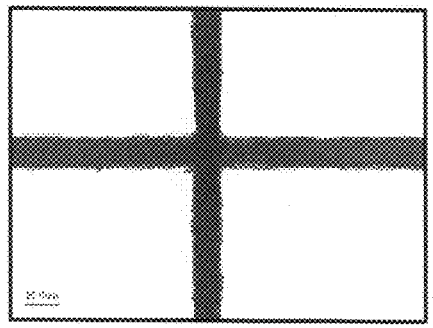
FIG. 8E is a view illustrating an image of a workpiece on which a protective film has been formed with use of a protective film substance according to Inventive Example 3 that has been prepared to make its absorbance, i.e., an absorbance converted for a solution diluted 200 times, equal to 0.97 per an optical path length of 1 cm, the workpiece having been laser-processed.

FIG. 8A illustrates an image of the workpiece 11 at the point of intersection with a protective film 29 formed, on the functional layer 15, from the protective film substance according to Inventive Example 3 that has been prepared to make its absorbance, i.e., an absorbance converted for a solution diluted 200 times, equal to 0.05 per an optical path length of 1 cm, the workpiece 11 having been laser-processed. Similarly, FIGS. 8B, 8C, 8D, and 8E illustrate respective images of the workpieces 11 at the points of intersection with protective films 29 formed, on the functional layers 15, from the protective film substance according to Inventive Example 3 that has been prepared to make its absorbance, i.e., an absorbance converted for a solution diluted 200 times, equal to 0.15, 0.34, 0.49, and 0.97 per an optical path length of 1 cm, the workpieces 11 having been laser-processed.

As illustrated in FIGS. 6A through 6E, 7A through 7E, and 8A through 8E, it has been found that no excessive processing failure occurs in laser processing if the solutions of the protective film substances according to Inventive Examples 1 through 3 have absorbances, i.e., absorbances converted for a solution diluted 200 times, of 0.05 or more. Moreover, it has also been found that better laser processing can be performed on the workpieces 11 if the absorbances are 0.15 or more.

After the workpiece 11 has been laser-processed, the frame unit 21 was delivered by a delivery arm, not illustrated, to a cleaning apparatus, not illustrated, where the face side of the workpiece 11 was cleaned. Specifically, the face side of the workpiece 11 was cleaned by cleaning water, e.g., pure water, ejected thereto. As a result, the protective film 29 as well as debris was removed from the workpiece 11 (removal by cleaning with water).

The workpiece 11 should preferably be cleaned by way of two-fluid cleaning, high-pressure cleaning, two-fluid steam cleaning, micro-nanobubble water cleaning, or the like. Cleaning water, e.g., water, used in the cleaning step may be at normal temperature or may be heated. If it is difficult to remove the protective film 29 from the workpiece 11 with only water cleaning, then the protective film 29 may be removed from the workpiece 11 by a cleaning step involving plasma processing, the application of an ultraviolet radiation having a wavelength of 185 nm and/or 254 nm, for example, the application of an excimer laser beam having a wavelength of 172 nm, for example, ozone water, or the like. The laser processing of the workpiece 11 is now finished.

The structural and methodical details according to the above embodiment may be changed and modified without departing from the scope of the present invention. For example, spin coating has been described above as a process of coating a surface to be processed of a workpiece with a protective film substance to cover the surface in its entirety with a protective film. However, an ultrasonic or electrostatic spray coating process, an ink jet process, or the like may be used instead of the spin coating process. After the spin coating process, the protective film on the workpiece may be dried by baking, the application of xenon pulses, the application of an infrared radiation, etc.

Moreover, since the light absorbent included in the protective film substance according to the present invention has an absorbance at a wavelength of 355 nm other than the wavelength of 532 nm, the protective film substance according to the present invention may be used to form a protective film on a surface of a workpiece that is to be processed by a laser beam having a wavelength of 355 nm.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a workpiece which has a functional layer with a plurality of devices, comprising:
   a protective film preparing step of preparing a protective film substance by preparing a solution including a water-soluble resin, an organic solvent, and a light absorbent;
   a dilution step of forming a diluted protective film substance by diluting the protective film substance 200 times with water;
   a measurement step of measuring an absorbance of the diluted protective film substance, such that an absorbance of the diluted protective film substance is equal to 0.05 or more per an optical path length of 1 cm at a wavelength of 532 nm;
   a protective film forming step of forming a protective film covering a surface of the functional layer with the plurality of devices to be processed of the workpiece by coating the surface of the functional layer with the plurality of devices with the protective film substance for laser processing; and
   a processing step of processing the workpiece by applying a laser beam having a wavelength absorbable by the workpiece and the protective film to the workpiece through the protective film.

2. The method of processing the workpiece according to claim 1, wherein the light absorbent includes a polyhydroxyanthraquinone derivative.

3. The method of processing the workpiece according to claim 2, wherein the polyhydroxyanthraquinone derivative includes carminic acid.

4. The method of processing the workpiece according to claim 3, wherein the solution has a pH in a range of 3 to 5.

5. The method of processing the workpiece according to claim 2, wherein the solution has a pH in a range of 3 to 5.

6. The method of processing the workpiece according to claim 1, wherein the solution has a pH in a range of 3 to 5.

7. The method of processing the workpiece according to claim 1, wherein the protective film preparing step further comprises performing an ion exchange process on the solution.

8. The method of processing the workpiece according to claim 1, wherein the protective film preparing step further comprises adding an additive to the solution which includes at least one of: ascorbic acid, trimethylol propane, triethanol amine, and methyl p-hydroxy benzoate.

9. The method of processing the workpiece according to claim 1, wherein the devices are integrated circuits.

10. The method of processing the workpiece according to claim 1, wherein the devices are separated by streets.

11. The method of processing the workpiece according to claim 1, wherein the workpiece is a silicon wafer.

* * * * *